United States Patent [19]

Kimura et al.

[11] Patent Number: 4,742,018
[45] Date of Patent: May 3, 1988

[54] PROCESS FOR PRODUCING MEMORY CELL HAVING STACKED CAPACITOR

[75] Inventors: Shinichiro Kimura, Hachioji; Hideo Sunami, Tokyo, both of Japan

[73] Assignee: Hitachi, Ltd., Tokyo, Japan

[21] Appl. No.: 936,602

[22] Filed: Dec. 1, 1986

[30] Foreign Application Priority Data

Nov. 29, 1985 [JP] Japan .................. 60-267533

[51] Int. Cl.$^4$ .................. H01L 21/70; H01L 27/00
[52] U.S. Cl. .................. 437/48; 437/52; 437/919; 357/23.6; 357/71; 148/DIG. 14; 365/149
[58] Field of Search .............. 357/23.6, 71; 29/576 C, 29/577 C, 571; 148/DIG. 14; 365/149; 437/919, 52, 48

[56] References Cited

U.S. PATENT DOCUMENTS 4,355,374 10/1982 Sakai et al. .................. 365/149

OTHER PUBLICATIONS

Koyanagi, et al., "Novel High Density, Stacked Capacitor MOS RAM," IEDM Technical Digest, 1978, pp. 348–351.

Koyanagi et al., "Novel High Density, Stacked Capacitor MOS RAM," Japanese Journal of Applied Physics, vol. 18, 1979, Supplement 18-1, pp. 35–42.

*Primary Examiner*—Brian E. Hearn
*Assistant Examiner*—Mary A. Wilczewski
*Attorney, Agent, or Firm*—Antonelli, Terry & Wands

[57] ABSTRACT

A process for producing a memory cell having a stacked capacitor. As the reduction in device size of memory cells progresses, it becomes difficult to obtain a satisfactorily large capacitance even with a stacked capacitor structure. To enable a larger capacitance to be obtained for the same occupied area, projections and recesses are provided on the surface of a capacitor electrode. It is possible, according to the process, to readily produce projections and recesses for increasing the storage capacitance.

10 Claims, 4 Drawing Sheets

PROCESS FOR PRODUCING MEMORY CELL HAVING STACKED CAPACITOR

BACKGROUND OF THE INVENTION

The present invention relates to a process for producing a charge storage capacitor for a dRAM (dynamic random access memory), which is minute and yet has a large capacity.

There has been a 4-fold increase in packing density of dRAM's in the last three years. The main production item of this type of memory has already been shifted from 64K-devices to 256K-devices, and the mass-production of 1M-bit dRAM's will soon be put into practice. This large integration of dRAM's has been accomplished by reduction in device size which is known as the "scaling rule". However, a decrease in storage capacitance which results from the reduction in device size leads to drawbacks such as a lowering of S/N ratio and undesirable signal reverse due to $\alpha$-particles, which gives rise to a serious problem in terms of reliability. In view of these circumstances, new types of capacitor cells which are designated to increase the storage capacitance are expected to replace the conventional planar type capacitor cell, such as a trench capacitor cell which utilizes the side wall of a trench provided in a substrate and a stacked capacitor cell which has a stacked capacitor section [see, "Novel high density, Stacked capacitor MOS RAM" by Koyanagi, Sumami, Hashimoto and Ashikawa in IEEE Int, Electron Devices Meeting Tech, Dig. pp. 348-351, December (1978)]. Among these improved capacitor cells, the stacked capacitor cell has become of major interest as one which has a capacitor structure that meets the future demand for further reduction in the device size because, unlike the trench capacitor cell, the stacked capacitor cell needs no advanced technique to provide a fine or minute trench in a substrate.

FIG. 1 is a sectional view of a dRAM having a conventional stacked capacitor cell. The process for producing this type of dRAM will briefly be explained below. First, an element isolation oxide 2 is grown on a single crystal substrate 1, and an oxide 3 which defines a gate oxide of a transistor is then grown. Impurity-containing polycrystalline silicon 4 is deposited to provide a gate electrode and processed. Thereafter, a source 5 and a drain 6 are formed by self-alignment process using ion implantation or the like. Then, to form a charge storage capacitor section, impurity-containing polycrystalline silicon 8 is deposited on a region above the drain. At this time, the polycrystalline silicon 8 is also formed on the gate electrode 4 and the element isolation oxide 2. Therefore, it is possible to increase the area of the capacitor section as compared with the conventional planar capacitor cell structure which utilizes the plane of the substrate alone. It should be noted that the gate electrode 4 is covered with an insulator 7 such as an oxide. As oxide 9 is then formed on the polycrystalline silicon 8, formed as described above, so as to provide an insulator for a capacitor cell. A conductor 10 is deposited on the oxide 9 to complete a capacitor cell. It should be noted that the reference numeral 11 denotes a protection film, 12 a word line electrode, 13 a data line electrode, and 14 a plate electrode.

In the above-described conventional stacked capacitor cell, however, the surface of the first-level polycrystalline silicon 8 alone is utilized, as shown in FIG. 1. Therefore, it is not necessarily possible to obtain a satisfactorily large capacitance, particularly in a cell which is reduced in device size to a great extent.

SUMMARY OF THE INVENTION

Accordingly, it is a primary object of the present invention to provide a process for producing a memory cell having a stacked capacitor, the process enabling realization of a capacitor cell which has an area equal to that of a conventional stacked capacitor cell and yet possesses a storage capacitance much larger than that of the conventional cell.

To this end, the present invention provides a process for producing a memory cell having a stacked capacitor, comprising the steps of: forming a transistor having a first semiconductor layer on a semiconductor substrate; forming a first conductor layer on the semiconductor substrate so that the first conductor layer is electrically connected to the first semiconductor layer; depositing a first insulator on the first conductor layer and removing the first insulator except for a necessary portion; depositing a second conductor layer on the first insulator so that the second conductor is electrically connected to the first conductor layer, and removing the second conductor except for a necessary portion; removing the first insulator alone; forming a second insulator on the respective surfaces of the first and second conductor layers; and forming a third conductor layer on the second insulator. By virtue of this method, recesses and projections are provided on the semiconductor layer which defines one of the electrodes of the capacitor, thereby allowing the surface area alone to be increased without increasing the area on the substrate occupied by the capacitor, and thus increasing the charge storage capacitance.

The above and other objects and many of the attendant advantages of this invention will be readily appreciated as the same becomes better understood by reference to the following detailed description when considered in connection with the accompanying drawings.

DETAILED DESCRIPTION OF THE INVENTION

Preferred embodiments of the present invention will be described hereinunder in detail with reference to the accompanying drawings.

FIGS. 2A to 2G are sectional views showing in combination a first embodiment of the process for producing a memory cell having a stacked capacitor according to the present invention, and FIGS. 3A to 3F are sectional views showing in combination a second embodiment of the process according to the present invention. In order to simplify the description of each of the embodiments, it is assumed that MOSFET's (Metal Oxide Semiconductor Field Effect Transistors) which serve as switching transistors of a dRAM have already been prepared by a known process, and only the process for producing a stacked capacitor of the dRAM will be described below.

Figure 1:
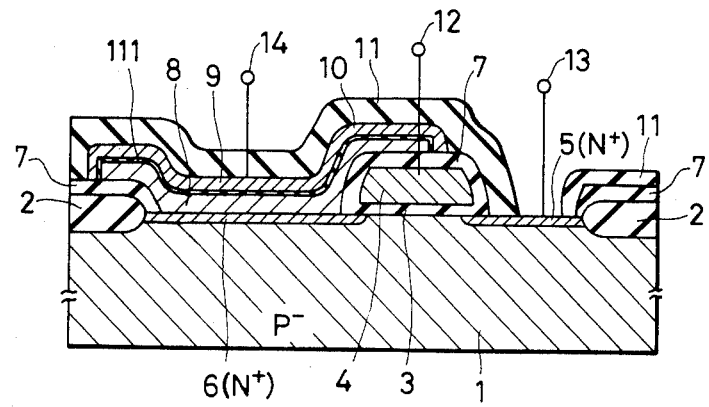
FIG. 1 is a sectional view of a memory cell having a conventional stacked capacitor.
Figure 2A:
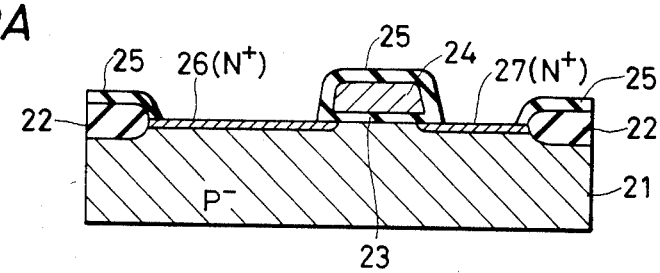
FIGS. 2A to 2G are sectional views showing in combination a first embodiment of the present invention.
Figure 2B:
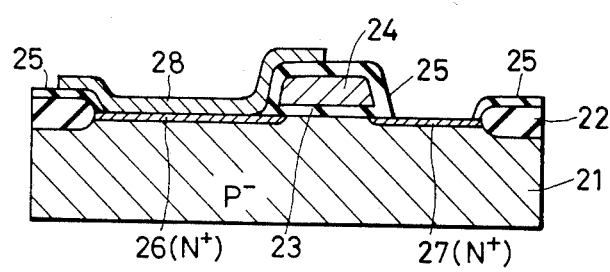
Figure 2C:
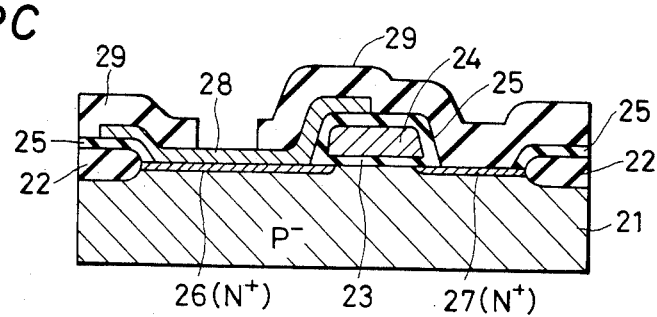
Figure 2D:
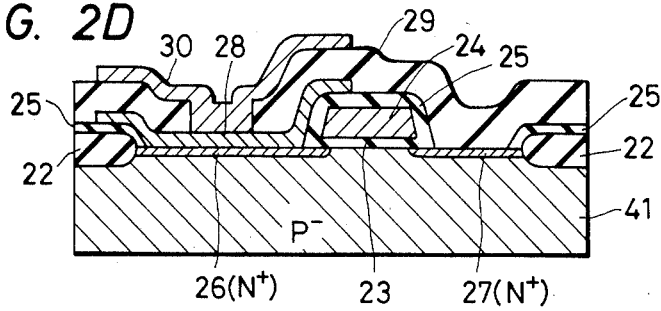
Figure 2E:
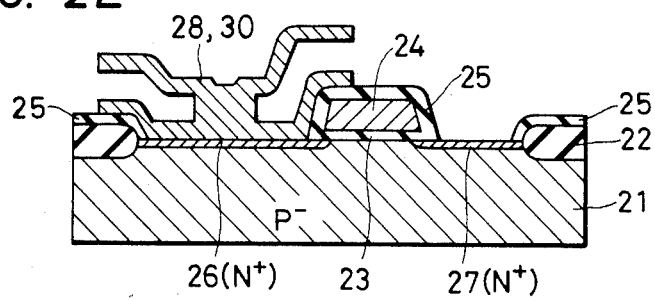

First Embodiment:

FIG. 2A shows a MOSFET formed in such a manner that a poly-silicon gate electrode 24 is provided on a gate insulator 23 and source and drain regions are formed by ion implantation in a self-alignment manner using the gate electrode 24 as a mask. An insulator 22 is formed by, for example, the LOCOS (Local Oxidation of Silicon) method. In this figure, the reference numeral 21 denotes a single crystal semiconductor substrate, 25 an intermediate insulator, 26 a drain region, and 27 a source region. Then, as shown in FIG. 2B, a first polycrystalline silicon layer 28 which defines a first conductor layer is deposited by a known LPCVD (Low Pressure Chemical Vapor Deposition) method so that the silicon layer 28 is in contact with the drain region 26 and covers a part of the gate electrode 24 and a part of the insulator 22. The respective conductivity types of the first polycrystalline silicon layer 28 and the drain region 26 must be coincident with each other so that they can be in ohmic contact with each other. However, when the first conductor layer is made of a metal, such consideration need not be taken. As shown in FIG. 2C, an oxide 29, such as $SiO_2$, which defines a first insulator is deposited on the substrate 21 by a known method, and then only a part of the first polycrystalline silicon layer 28 is exposed using a known processing technique such as photo-lithography or dry-etching. Further, as shown in FIG. 2D, a second polycrystalline silicon layer 30 which defines a second conductor layer is deposited on the oxide 29 using the same technique as that employed to deposit the first polycrystalline silicon layer 28, and the second polycrystalline silicon layer 30 is removed with only a necessary portion left. It should be noted that the conductivity type of the second polycrystalline silicon layer 30 is made the same as that of the first polycrystalline silicon layer 28. Then, the oxide 29, i.e., the first insulator, alone is selectively removed as shown in FIG. 2E. To thoroughly remove even a portion of the oxide 29 which is located in horizontal grooves shown in FIG. 2E, it is preferable to employ a processing method which enables completely isotropic etching. In this embodiment, a mixture of hydrofluoric acid and ammonium fluoride is employed for the etching. However, if the required isotropic etching can be effected, dry-etching may also be employed.

Figure 2F:
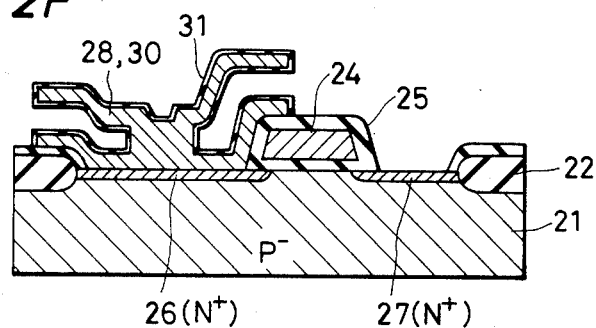
Figure 2G:
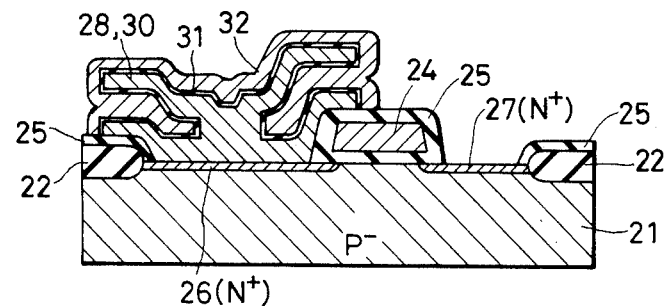

Then, a high-temperature heat treatment is carried out in an oxidizing atmosphere to grow a second insulator 31 which defines a dielectric for a capacitor on the whole surfaces of the polycrystalline silicon layers 28 and 30 as shown in FIG. 2F. The second insulator 31 may be defined by an oxide obtained by oxidizing polycrystalline silicon, or an insulator such as silicon nitride. Finally, as shown in FIG. 2G, a third polycrystalline silicon layer 32 which defines a third conductor serving as one of the electrodes of a capacitor is deposited on the whole surface of the oxide 31, thus completing a capacitor. At this time, employment of a technique which enables deposition of film under low pressure such as a known LPCVD method permits the polycrystalline silicon layer 32 to be buried even in deep horizontal grooves such as those shown in FIG. 2F so that no gap is present in the grooves. As materials for the first, second and third conductors, it is possible to employ metals such as Al, W and Ti and silicides of these metals.

Figure 3A:
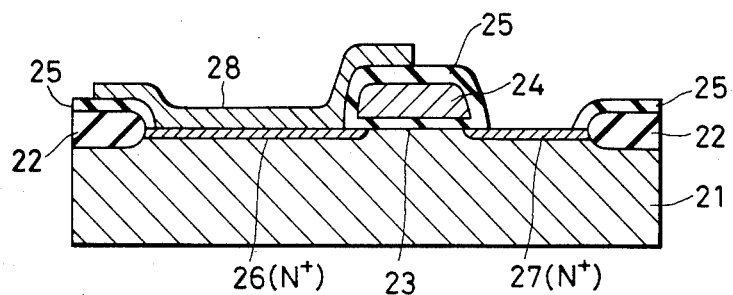
FIGS. 3A to 3F are sectional views showing in combination a second embodiment of the present invention.
Figure 3B:
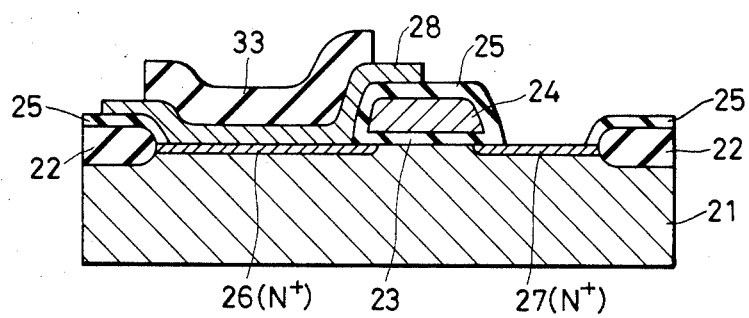
Figure 3C:
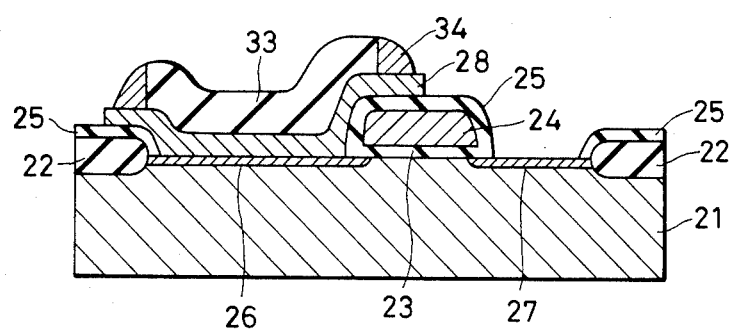
Figure 3D:
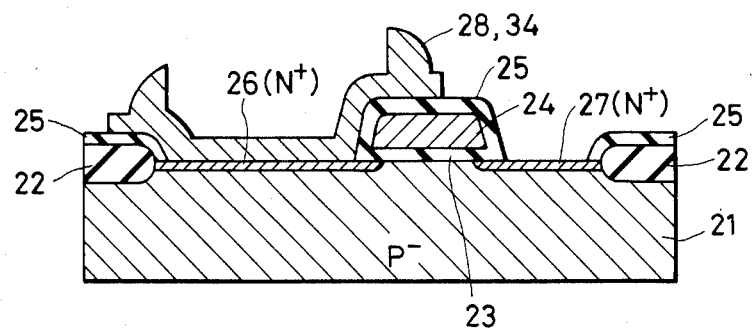
Figure 3E:
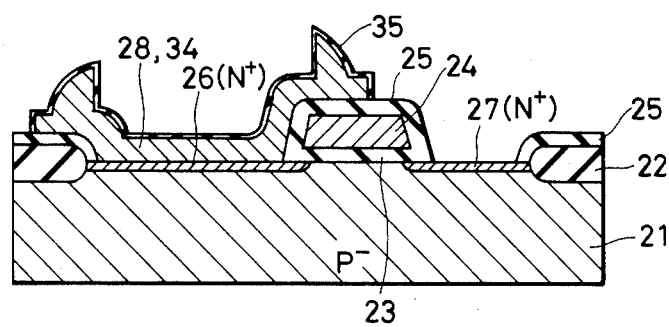
Figure 3F:
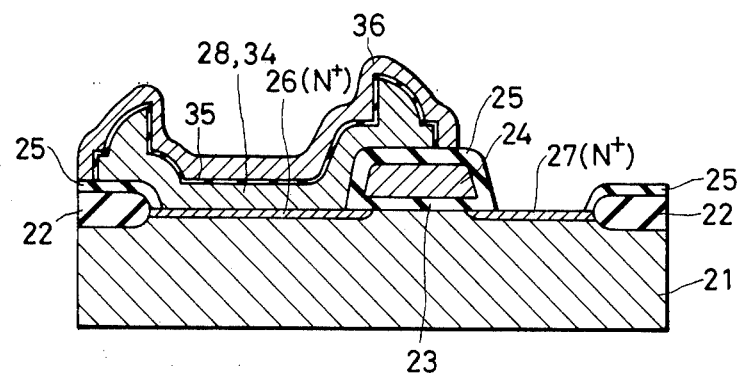

Second Embodiment:

After a MOSFET has been fabricated on a single crystal semiconductor substrate 21 by a known method in a manner similar to that in the first embodiment shown in FIG. 2, a first polycrystalline silicon layer 28 which defines a first conductor layer is deposited on a drain region 26 as shown in FIG. 3A, and an oxide 33 which defines a first insulator is deposited as shown in FIG. 3B, and then the oxide 33 is removed with only a necessary portion left. A second polycrystalline silicon layer 34 which defines a second conductor layer and has the same conductivity type as that of the first polycrystalline silicon 28 is deposited on the whole surface of this structure, and the second polycrystalline silicon layer 34 is selectively removed by a method which enables anisotropic etching such as dry-etching. In consequence, as shown in FIG. 3C, the second polycrystalline silicon layer 34 is left only on the side wall portions of the oxide 33 in the form of so-called side walls. Then, as shown in FIG. 3D, the oxide 33 alone is removed to expose the respective surfaces of the polycrystalline silicon layers 28 and 34. An oxide 35 which defines a second insulator is grown on the exposed surfaces of the polycrystalline silicon layers 28 and 34 in a high-temperature oxidizing atmosphere, thereby forming a dielectric for a capacitor as shown in FIG. 3E. Thereafter, as shown in FIG. 3F, a third polycrystalline silicon layer 36 which defines a third conductor layer serving as the other electrode of a capacitor is deposited on the whole surface of the oxide 35, thus completing a capacitor.

As described above, the present invention provides a process for producing a memory cell having a stacked capacitor, comprising the steps of: forming a transistor having a first semiconductor layer on a semiconductor substrate; forming a first conductor layer on the semiconductor substrate so that the first conductor layer is electrically connected to the first semiconductor layer; depositing a first insulator on the first conductor layer and removing the first insulator except for a necessary portion; depositing second conductor layer on the first insulator so that the second conductor is electrically connected to the first conductor layer, and removing the second conductor except for a necessary portion; removing the first insulator alone; forming a second insulator on the respective surfaces of the first and second conductor layers; and forming a third conductor layer on the second insulator. By virtue of this method, it is possible to obtain a larger charge storage capacitance than that of the conventional stacked capacitor cell (about three times in the first embodiment; about 1.5 times in the second embodiment) for the same occupied area of the capacitor in the dRAM. Accordingly, even a fine or minute dRAM can have a satisfactorily large S/N ratio, and the area of a depletion layer generated at the lower side of the capacitor can be minimized, so that it is possible to realize a semiconductor memory which is highly resistant to α-particles and excellent in terms of reliability.

It is further understood by those skilled in the art that the foregoing description is preferred embodiments of the disclosed device and that various changes and modifications may be made in the invention without departing from the spirit and scope thereof.

What is claimed is:

1. A process for producing a dynamic random access memory cell having a stacked capacitor, comprising the steps of:

forming a MOSFET having a gate electrode, a drain region and a source region, the drain and source regions being formed in a semiconductor substrate;

forming a first conductor layer on said semiconductor substrate so that said first conductor layer is electrically connected to said drain region;

depositing a first insulator film on said first conductor layer and removing said first insulator film except for a necessary portion;

depositing a second conductor layer on said first insulator so that said second conductor layer is electrically connected to said first conductor layer, and removing said second conductor layer except for a necessary portion;

removing said first insulator film alone;

forming a second insulator film on the respective surfaces of said first and second conductor layers; and forming a third conductor layer on said second insulator film.

2. A process for producing a dynamic random access memory cell having a stacked capacitor according to claim 1, wherein each of said steps is carried out at least once.

3. A process for producing a dynamic random access memory cell having a stacked capacitor according to claim 1, wherein said second insulator film contains at least either silicon oxide or silicon nitride.

4. A process for producing a dynamic random access memory cell having a stacked capacitor according to claim 3, wherein said third conductor layer is formed by low pressure chemical vapor deposition.

5. A process for producing a dynamic random access memory cell having a stacked capacitor according to claim 1, wherein the first insulator film is removed alone by isotropically etching the first insulator film.

6. A process for producing a dynamic random access memory cell having a stacked capacitor according to claim 1, wherein the first, second and third conductor layers are made of conductive materials selected from the group consisting of Al, W, Ti and silicides thereof.

7. A process for producing a dynamic random access memory cell having a stacked capacitor according to claim 1, wherein each of the first, second and third conductor layers are formed of polycrystalline silicon doped with impurities.

8. A process for producing a dynamic random access memory cell having a stacked capacitor according to claim 7, wherein the drain region is of a first conductivity type, and wherein the first and second conductor layers are doped with impurities such that each of the first and second conductor layers are of the same conductivity types as that of the drain region.

9. A process for producing a dynamic random access memory cell having a stacked capacitor according to claim 1, wherein the second conductor layer is formed on top of the necessary portion of the first insulator film.

10. A process for producing a dynamic random access memory cell having a stacked capacitor according to claim 1, wherein the second conductor layer is formed at the sides of the necessary portion of the first insulator film.

* * * * *